(12) United States Patent
Kim et al.

(10) Patent No.: US 8,330,512 B2
(45) Date of Patent: Dec. 11, 2012

(54) VARIABLE UNIT DELAY CIRCUIT AND CLOCK GENERATION CIRCUIT FOR SEMICONDUCTOR APPARATUS USING THE SAME

(75) Inventors: Ki Han Kim, Ichon-shi (KR); Dong Suk Shin, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 161 days.

(21) Appl. No.: 12/843,568

(22) Filed: Jul. 26, 2010

(65) Prior Publication Data

US 2011/0234279 A1 Sep. 29, 2011

(30) Foreign Application Priority Data

Mar. 29, 2010 (KR) .................. 10-2010-0027895

(51) Int. Cl.
*H03L 7/06* (2006.01)
(52) U.S. Cl. ......... 327/158; 327/149; 375/373; 375/376
(58) Field of Classification Search .................. 327/158, 327/149; 375/373, 376
See application file for complete search history.

(56) References Cited

U.S. PATENT DOCUMENTS

| | | | |
|---|---|---|---|
| 6,525,988 B2 | 2/2003 | Ryu et al. | |
| 6,825,703 B1 | 11/2004 | Kwak | |
| 6,828,835 B2 | 12/2004 | Cho | |
| 6,876,239 B2 * | 4/2005 | Bell | 327/158 |
| 6,937,530 B2 * | 8/2005 | Bell | 365/189.02 |
| 7,046,061 B2 | 5/2006 | Kwak | |
| 7,375,565 B2 * | 5/2008 | Kwak | 327/158 |
| 7,683,684 B2 * | 3/2010 | Lee et al. | 327/158 |
| 7,733,140 B2 * | 6/2010 | Kwak | 327/158 |
| 7,868,673 B2 * | 1/2011 | Lee et al. | 327/158 |
| 2004/0100312 A1 | 5/2004 | Cho | |
| 2006/0020835 A1 | 1/2006 | Samson et al. | |
| 2008/0164917 A1 * | 7/2008 | Floyd et al. | 327/117 |
| 2008/0320215 A1 * | 12/2008 | Kashiwa | 711/105 |
| 2010/0060332 A1 * | 3/2010 | Song et al. | 327/156 |
| 2010/0134155 A1 * | 6/2010 | Lee et al. | 327/143 |

FOREIGN PATENT DOCUMENTS

| | | |
|---|---|---|
| JP | 2005-020686 | 1/2005 |
| KR | 1020080011834 A | 2/2008 |
| KR | 1020090048470 A | 5/2009 |

* cited by examiner

*Primary Examiner* — Ryan Jager
(74) *Attorney, Agent, or Firm* — William Park & Associates Ltd.

(57) ABSTRACT

A clock generation circuit of a semiconductor apparatus includes a first phase detection block configured to compare initial phases of a reference clock signal and an output clock signal in response to an operation start signal, and output an initial phase difference detection signal corresponding to a comparison result; a second phase detection block configured to compare phases of the reference clock signal and the output clock signal, and output a phase detection signal corresponding to a comparison result; a variable unit delay block determined in a control range of the delay amount thereof in response to the initial phase difference detection signal, and configured to delay the reference clock signal by a delay amount corresponding to a voltage level of a control voltage and output the output clock signal; and a delay control block configured to generate the control voltage which has the voltage level corresponding to the phase detection signal.

11 Claims, 8 Drawing Sheets

VARIABLE UNIT DELAY CIRCUIT AND CLOCK GENERATION CIRCUIT FOR SEMICONDUCTOR APPARATUS USING THE SAME

CROSS-REFERENCES TO RELATED APPLICATION

The present application claims priority under 35 U.S.C. §119(a) to Korean Application No. 10-2010-0027895, filed on Mar. 29, 2010, in the Korean Intellectual Property Office, which is incorporated herein by reference in its entirety as if set forth in full.

BACKGROUND

1. Technical Field

The present invention relates to a semiconductor apparatus, and more particularly, to technologies for configuring a variable unit delay circuit and a clock generation circuit of a semiconductor apparatus.

2. Related Art

A semiconductor apparatus typically operates in synchronization with a periodic reference pulse signal such as a clock so as to improve an operational speed and ensure efficient internal operation. In fact, most semiconductor apparatuses operate using clock signals supplied from outside or internal clocks generated inside as needed by the circumstances.

A clock generation circuit such as a delay locked loop (DLL) is provided in order to compensate for a timing difference between an external clock signal and an internal clock signal. Such clock generation circuit comprises a plurality of unit delay cells therein so as to generate an output clock signal. In general, increase in the number of unit delay cells disadvantageously affects an area and current consumption. Therefore, a technology capable of minimizing the unit delay cell is necessary in the art.

SUMMARY

In one embodiment of the present invention, a variable unit delay circuit includes: a delayed pulse generation unit configured to generate a first delayed pulse signal which has a delayed transition timing after a rising edge of a reference clock signal in a high level duration of the reference clock signal and a second delayed pulse signal which has a delayed transition timing after a falling edge of the reference clock signal in a low level duration of the reference clock signal; a clock driving signal generation unit configured to generate a clock rising driving signal which is activated at the transition timing of the first delayed pulse signal and a clock falling driving signal which is activated at the transition timing of the second delayed pulse signal; and a clock output unit configured to output an output clock signal in response to the clock rising driving signal and the clock falling driving signal.

In another embodiment of the present invention, a variable unit delay circuit includes: a clock dividing unit configured to divide a reference clock signal, and output a first divided clock signal and a second divided clock signal which is delayed more by one half cycle of the reference clock signal than the first divided clock signal; a first delayed pulse generation unit configured to generate a first delayed pulse signal which has a delayed transition timing after a rising edge of the first divided clock signal in a high level duration of the first divided clock signal and a second delayed pulse signal which has a delayed transition timing after a falling edge of the first divided clock signal in a low level duration of the first divided clock signal; a second delayed pulse generation unit configured to generate a third delayed pulse signal which has a delayed transition timing after a rising edge of the second divided clock signal in a high level duration of the second divided clock signal and a fourth delayed pulse signal which has a delayed transition timing after a falling edge of the second divided clock signal in a low level duration of the second divided clock signal; a clock rising driving signal generation unit configured to generate a clock rising driving signal which is activated at the respective transition timings of the first delayed pulse signal and the second delayed pulse signal; a clock falling driving signal generation unit configured to generate a clock falling driving signal which is activated at the respective transition timings of the third delayed pulse signal and the fourth delayed pulse signal; and a clock output unit configured to output an output clock signal in response to the clock rising driving signal and the clock falling driving signal.

In another embodiment of the present invention, a variable unit delay circuit includes: a delayed pulse generation unit configured to generate a first delayed pulse signal which has a delayed transition timing after a rising edge of a reference clock signal in a high level duration of the reference clock signal and a second delayed pulse signal which has a delayed transition timing after a falling edge of the reference clock signal in a low level duration of the reference clock signal; a clock rising driving signal generation unit configured to generate a clock rising driving signal which is activated at the transition timing of the first delayed pulse signal, when an initial phase difference detection signal is deactivated, and which is activated at the transition timing of the second delayed pulse signal, when the initial phase difference detection signal is activated; a clock falling driving signal generation unit configured to generate a clock falling driving signal which is activated at the transition timing of the second delayed pulse signal, when the initial phase difference detection signal is deactivated, and which is activated at the transition timing of the first delayed pulse signal, when the initial phase difference detection signal is activated; and a clock output unit configured to output an output clock signal in response to the clock rising driving signal and the clock falling driving signal.

In another embodiment of the present invention, a clock generation circuit of a semiconductor apparatus includes: a first phase detection block configured to compare initial phases of a reference clock signal and an output clock signal in response to an operation start signal, and output an initial phase difference detection signal corresponding to a comparison result; a second phase detection block configured to compare phases of the reference clock signal and the output clock signal, and output a phase detection signal corresponding to a comparison result; a variable unit delay block determined in a control range of the delay amount thereof in response to the initial phase difference detection signal, and configured to delay the reference clock signal by a delay amount corresponding to a voltage level of a control voltage and output the output clock signal; and a delay control block configured to generate the control voltage which has the voltage level corresponding to the phase detection signal.

In another embodiment of the present invention, a method for generating a clock signal through a variable unit delay block configured to delay a reference clock signal and output an output clock signal includes the steps of: detecting an initial phase difference between the reference clock signal and the output clock signal; determining a control range of the delay amount of the variable unit delay block based on a detection result for the initial phase difference; and controlling a delay amount of the variable unit delay block within the control range of the delay amount.

BRIEF DESCRIPTION OF THE DRAWINGS

Features, aspects, and embodiments are described in conjunction with the attached drawings, in which.

DETAILED DESCRIPTION

Hereinafter, a variable unit delay circuit and a clock generation circuit of a semiconductor apparatus using the same according to the present invention will be described below with reference to the accompanying drawings through specific embodiments. For reference, since terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry. Also, the logic signals of a circuit and binary data values are divided into a high level (H) or a low level (L) in correspondence to voltage levels and may be represented as '1' and '0'. Further, as the occasion demands, a high impedance state (a high-Z state) may be defined and described.

Figure 1:
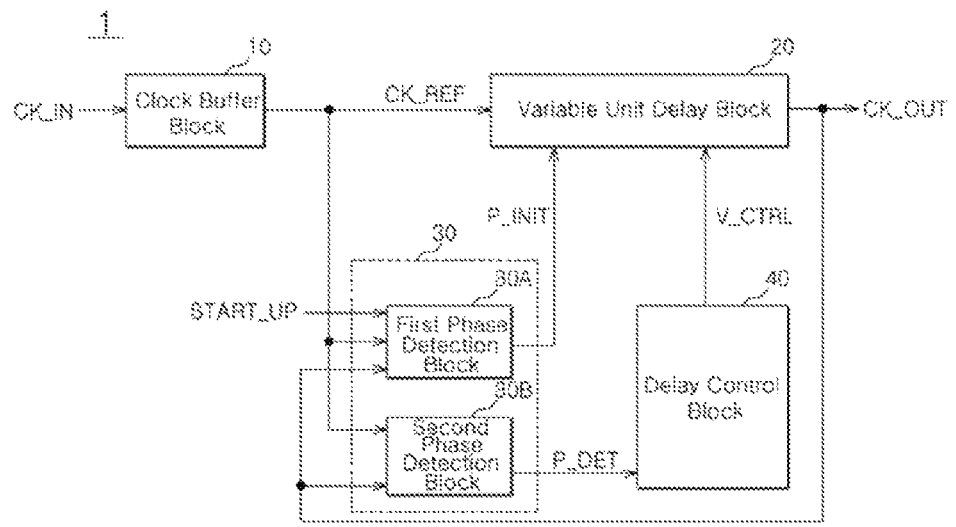
FIG. 1 is a block diagram illustrating a clock generation circuit of a semiconductor apparatus in accordance with an embodiment of the present invention.

FIG. 1 is a block diagram illustrating a clock generation circuit of a semiconductor apparatus in accordance with an embodiment of the present invention.

A clock generation circuit 1 of a semiconductor apparatus in accordance with the embodiment includes only a simplified diagram for the sake of clear description of the technical ideas offered by the embodiment of the invention.

Referring to FIG. 1, the clock generation circuit 1 for the semiconductor apparatus in accordance with the embodiment comprises a clock buffer block 10, a phase detection block 30, a variable unit delay block 20, and a delay control block 40.

The detailed configuration and principal operations of the clock generation circuit 1 of the semiconductor apparatus is described below.

The clock buffer block 10 is configured to buffer an input clock signal CK_IN to output a reference clock signal CK_REF. The clock buffer block 10 buffers the input clock signal CK_IN in such a way as to be suited for the internal operation voltage of a semiconductor apparatus. In the embodiment, the clock buffer block 10 is not an essential part of the invention, and may be omitted depending on the actual implementation.

The phase detection block 30 is configured to compare the phases of the reference clock signal CK_REF and an output clock signal CK_OUT to output a phase detection signal P_DET in correspondence to a comparison result. The phase detection block 30 is also configured to compare the initial phases of the reference clock signal CK_REF and the output clock signal CK_OUT when an operation start signal START_UP is activated, and output an initial phase difference detection signal P_INIT. The phase detection signal P_DET is a signal which has a pulse width corresponding to a phase difference, and the initial phase difference detection signal P_INIT is a signal which is activated when an initial phase difference is equal to or greater than a target value. The operation start signal START_UP can be generated using a power up signal, which is a signal that notifies power supply is stabilized.

In the embodiment, the phase detection block 30 comprises a first phase detection block 30A and a second phase detection block 30B. The first phase detection block 30A is configured to compare the initial phases of the reference clock signal CK_REF and the output clock signal CK_OUT in response to the operation start signal SRART_UP and output the initial phase difference detection signal P_INIT corresponding to a comparison result. The second phase detection block 30B is configured to compare the phases of the reference clock signal CK_REF and the output clock signal CK_OUT to output the phase detection signal P_DET corresponding to a comparison result. For reference, it is preferred that the first phase detection block 30A be designed to compare the initial phases of the reference clock signal CK_REF and the output clock signal CK_OUT during a preset initial period in a power-up operation and latch a comparison result. Meanwhile, based on an actual implementation, the first phase detection block 30A can be designed to continuously compare the reference clock signal CK_REF with the output clock signal CK_OUT.

The variable unit delay block 20 determines the control range of a delay amount in response to the initial phase difference detection signal P_INIT, and is configured to delay the reference clock signal CK_REF by the delay amount corresponding to the voltage level of a control voltage V_CTRL to output the output clock signal CK_OUT.

The delay control block 40 is configured to generate the control voltage V_CTRL which has a voltage level corresponding to the phase detection signal P_DET. That is to say, if the phase detection signal P_DET is a signal of a type whose pulse width can be controlled, the voltage level of the control voltage V_CTRL is determined based on the pulse width of the phase detection signal P_DET.

For reference, the control range of the delay amount of the variable unit delay block 20 can be determined to be a range of the delay amount corresponding to one half cycle or one cycle of the reference clock signal CK_REF. Assuming that the control range of the delay amount of the variable unit delay block 20 is determined to be one cycle when the initial phase difference detection signal P_INIT is activated, the operations of the clock generation circuit 1 of a semiconductor apparatus in accordance with the embodiment of the present invention will be described below.

If the operation start signal SRART_UP is activated, the phase detection block 30 compares the initial phases of the reference clock signal CK_REF with the output clock signal CK_OUT, and when a phase difference exceeds a preset range, activates and outputs the initial phase difference detection signal P_INIT. If the initial phase difference detection signal P_INIT is activated, the variable unit delay block 20 can delay the reference clock signal CK_REF up to a delay amount corresponding to one cycle at the maximum. The delay amount of the variable unit delay block 20 is controlled based on the voltage level of the control voltage V_CTRL within the determined control range of the delay amount. The voltage level of the control voltage V_CTRL is determined based on a phase comparison result between the reference clock signal CK_REF and the output clock signal CK_OUT. As a result, the voltage level of the control voltage V_CTRL is controlled until the phases of the reference clock signal CK_REF and the output clock signal CK_OUT coincide. If the phases of the reference clock signal CK_REF and the output clock signal CK_OUT coincide, the control voltage V_CTRL is locked. In other words, the control range of the delay amount of the variable unit delay block 20 is determined to be a delay amount corresponding to one half cycle or one cycle based on the initial phase difference between the reference clock signal CK_REF and the output clock signal CK_OUT.

A method for generating a clock signal through a variable unit delay block, which delays a reference clock signal and outputs an output clock signal as described above, comprises the steps of detecting an initial phase difference between the reference clock signal and the output clock signal; determining the control range of the delay amount of the variable unit delay block based on a detection result for the initial phase difference; and controlling the delay amount of the variable unit delay block within the control range of the delay amount.

In the clock generation circuit 1 of a semiconductor apparatus in accordance with the embodiment of the present invention, since the delay amount of the reference clock signal CK_REF can be controlled within a control range of the delay amount corresponding to one half cycle of the reference clock signal CK_REF or a control range of the delay amount corresponding to one cycle of the reference clock signal CK_REF through the single variable unit delay block 20, advantages in spatial efficiency and power consumption can be obtained.

Figure 2:
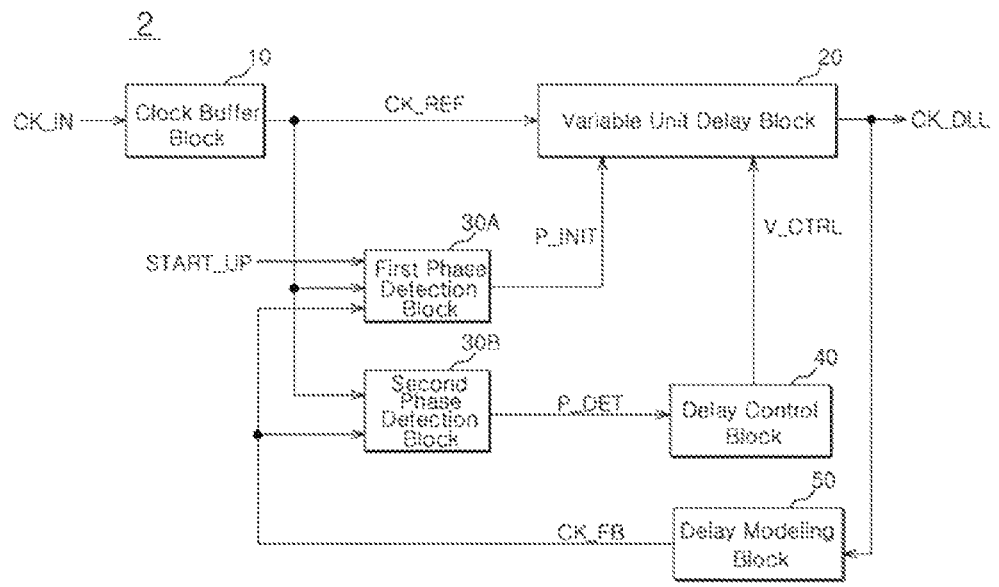
FIG. 2 is a block diagram illustrating a delay locked loop of a semiconductor apparatus in accordance with another embodiment of the present invention.

FIG. 2 is a block diagram illustrating a delay locked loop (DLL) of a semiconductor apparatus in accordance with another embodiment of the present invention.

A delay locked loop 2 of a semiconductor apparatus in accordance with another embodiment of the present invention includes only a simplified diagram for the sake of clear description of the technical ideas offered by the embodiment of the invention.

Referring to FIG. 2, the delay locked loop 2 of a semiconductor apparatus in accordance with another embodiment of the present invention includes a clock buffer block 10, a first phase detection block 30A, a variable unit delay block 20, a second phase detection block 30B, a delay control block 40, and a delay modeling block 50.

The detailed configuration and principal operations of the delay locked loop 2 of a semiconductor apparatus configured as mentioned above will be described below.

The clock buffer block 10 is configured to buffer an input clock signal CK_IN to output a reference clock signal CK_REF. The clock buffer block 10 buffers the input clock signal CK_IN in such a way as to be suited for the internal operation voltage of a semiconductor apparatus. In the embodiment, the clock buffer block 10 is not an essential element, and can be omitted depending on actual implementation.

The first phase detection block 30A is configured to compare the initial phases of the reference clock signal CK_REF and a feedback clock signal CK_FB and output an initial phase difference detection signal P_INIT corresponding to a comparison result. The initial phase difference detection signal P_INIT is a signal which is activated when an initial phase difference is equal to or greater than a target value. In the embodiment, the first phase detection block 30A generates the initial phase difference detection signal P_INIT under the control of an operation start signal START_UP. The operation start signal START_UP can be generated using a power up signal which is a signal that notifies power supply is stabilized.

The variable unit delay block 20 determines the control range of a delay amount in response to the initial phase difference detection signal P_INIT, and is configured to delay the reference clock signal CK_REF by the delay amount corresponding to the voltage level of a control voltage V_CTRL and output a DLL clock signal CK_DLL.

The second phase detection block 30B is configured to compare the phases of the reference clock signal CK_REF and the feedback clock signal CK_FB and output a phase detection signal P_DET corresponding to a comparison result. The phase detection signal P_DET may be defined as a signal which has a pulse width corresponding to a phase difference.

The delay control block 40 is configured to generate the control voltage V_CTRL which has a voltage level corresponding to the comparison result of the second phase detection block 30B. That is to say, if the phase detection signal P_DET is a signal of a type whose pulse width can be controlled, the voltage level of the control voltage V_CTRL is determined based on the pulse width of the phase detection signal P_DET.

The delay modeling block 50 is configured to delay the DLL clock signal CK_DLL by a model delay amount and output the feedback clock signal CK_FB. For reference, the model delay amount is determined based on the delay amount of the clock buffer block 10 and the delay amount of the transmission path of the DLL clock signal CK_DLL.

The control range of the delay amount of the variable unit delay block 20 may be determined to be a range of the delay amount corresponding to one half cycle or one cycle of the reference clock signal CK_REF. Assuming that the control range of the delay amount of the variable unit delay block 20 is determined to be one cycle when the initial phase difference detection signal P_INIT is activated, the operations of the delay locked loop 2 of a semiconductor apparatus in accordance with the embodiment of the present invention will be described below.

If the operation start signal SRART_UP is activated, the first phase detection block 30A compares the initial phases of the reference clock signal CK_REF and the feedback clock signal CK_FB. If the phase difference exceeds a preset range, the first phase detection block 30A activates and outputs the initial phase difference detection signal P_INIT. If the initial phase difference detection signal P_INIT is activated, the variable unit delay block 20 may delay the reference clock signal CK_REF up to a delay amount corresponding to one cycle at the maximum.

The delay amount of the variable unit delay block 20 is controlled based on the voltage level of the control voltage V_CTRL within the determined control range of the delay amount. The voltage level of the control voltage V_CTRL is determined based on a phase comparison result between the reference clock signal CK_REF and the feedback clock signal CK_FB. As a result, the voltage level of the control voltage V_CTRL is controlled until the phases of the reference clock signal CK_REF and the feedback clock signal CK_FB coincide. If the phases of the reference clock signal CK_REF and the feedback clock signal CK_FB coincide, the control voltage V_CTRL is locked. In other words, the delay locked loop (DLL) is internally locked.

As described above, the delay locked loop of a semiconductor apparatus are driven by a method comprising the steps of detecting an initial phase difference between the reference clock signal and the feedback clock signal; determining the control range of the delay amount of the variable unit delay block based on a detection result for the initial phase difference; and controlling the delay amount of the variable unit delay block within the control range of the delay amount.

In the delay locked loop 2 of a semiconductor apparatus in accordance with the embodiment of the present invention, since the delay amount of the reference clock signal CK_REF can be selectively controlled within a control range of the delay amount corresponding to one half cycle of the reference clock signal CK_REF or a control range of the delay amount corresponding to one cycle of the reference clock signal CK_REF by the single variable unit delay block 20, advantages in spatial efficiency and power consumption can be obtained.

Figure 3:
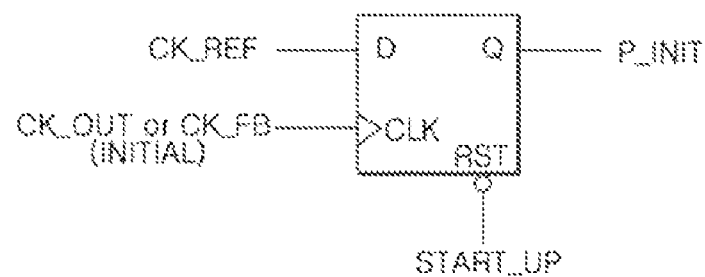
FIG. 3 is a circuit diagram illustrating an embodiment of a first phase detection block.

FIG. 3 is a circuit diagram illustrating an embodiment of the first phase detection block 30A.

Referring to FIG. 3, the first phase detection block 30A comprises a D flip-flop which receives the reference clock signal CK_REF as an input signal, the operation start signal START_UP as an internal reset signal, and the output clock signal CK_OUT as an internal clock signal.

Figure 4:
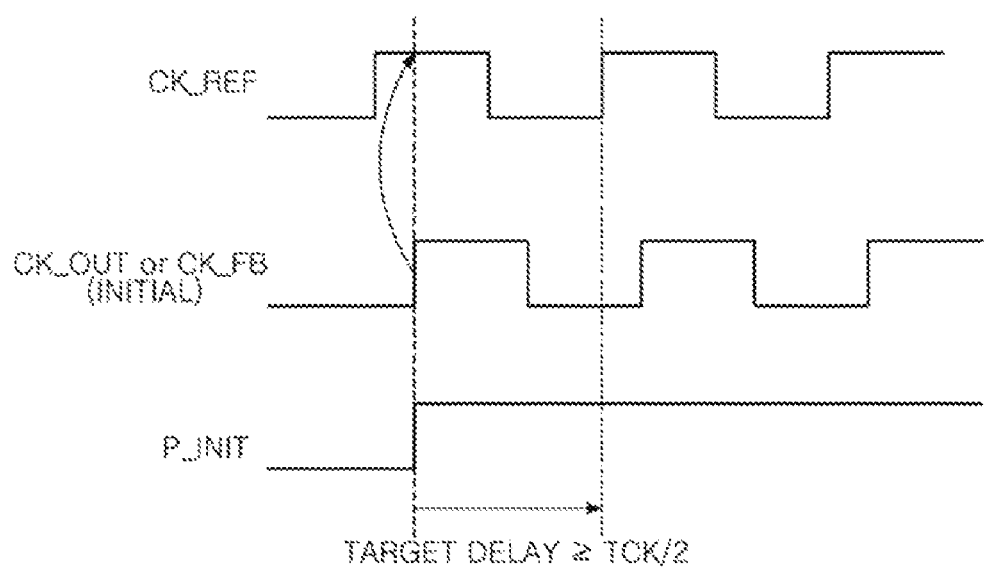
FIG. 4 is a timing diagram illustrating the internal operations of the first phase detection block.

FIG. 4 is a timing diagram illustrating the internal operations of the first phase detection block 30A.

The internal operation of the first phase detection block 30A configured as mentioned above will be described below with reference to the timing diagram of FIG. 4 together with FIG. 3.

FIG. 4 shows that, if the output clock signal CK_OUT rises in a high level duration of the reference clock signal CK_REF, the initial phase difference detection signal P_INIT of a high level is outputted from the D flip-flop. At this time, in order to make the phases of the reference clock signal CK_REF and the output clock signal CK_OUT coincide, the reference clock signal CK_REF should be delayed by a delay amount corresponding to at least one half cycle of the reference clock signal CK_REF.

Figure 5:
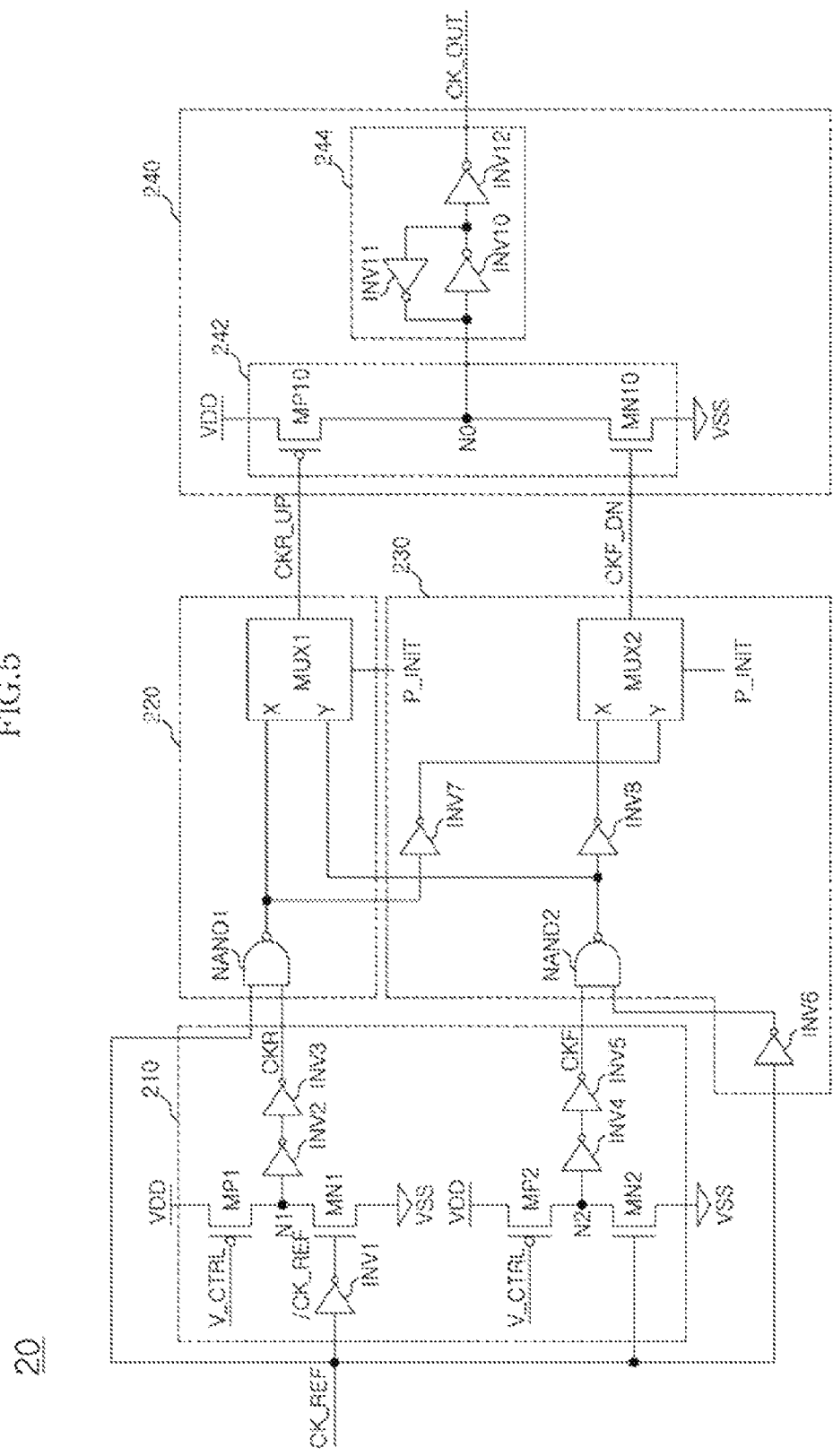
FIG. 5 is a circuit diagram illustrating an embodiment of a variable unit delay block.

FIG. 5 is a circuit diagram illustrating an embodiment of the variable unit delay block 20.

Referring to FIG. 5, the variable unit delay block 20 includes a delayed pulse generation unit 210, a clock rising driving signal generation unit 220, a clock falling driving signal generation unit 230, and a clock output unit 240.

The delayed pulse generation unit 210 is configured to generate a first delayed pulse signal CKR which has a delayed transition timing after the rising edge of the reference clock signal CK_REF in the high level duration of the reference clock signal CK_REF and a second delayed pulse signal CKF which has a delayed transition timing after the falling edge of the reference clock signal CK_REF in the low level duration of the reference clock signal CK_REF. The delay amounts of the first and second delayed pulse signals CKR and CKF are controlled based on the voltage level of the control voltage V_CTRL. The delay amounts of the first and second delayed pulse signals CKR and CKF can be set to be the same or different from each other. The delayed pulse generation unit 210 includes a first pull-up driving section MP1 configured to control a pull-up driving force to a first output terminal N1 according to the voltage level of the control voltage V_CTRL, a first pull-down driving section MN1 configured to pull-down drive the first output terminal N1 under the control of the inverted signal of the reference clock signal CK_REF, a second pull-up driving section MP2 configured to control a pull-up driving force to a second output terminal N2 according to the voltage level of the control voltage V_CTRL, and a second pull-down driving section MN2 configured to pull-down drive the second output terminal N2 under the control of the reference clock signal CK_REF.

The clock rising driving signal generation unit 220 is configured to generate a clock rising driving signal CKR_UP which is activated at the transition timing of the first delayed pulse signal CKR. If the initial phase difference detection signal P_INIT is activated, the clock rising driving signal generation unit 220 generates the clock rising driving signal CKR_UP which is activated at the transition timing of the second delayed pulse signal CKF. The clock rising driving signal generation unit 220 includes a first select section MUX1 configured to output the clock rising driving signal CKR_UP which is activated in correspondence to the first delayed pulse signal CKR or the second delayed pulse signal CKF under the control of the initial phase difference detection signal P_INIT.

The clock falling driving signal generation unit 230 is configured to generate a clock falling driving signal CKF_DN which is activated at the transition timing of the second delayed pulse signal CKF. If the initial phase difference detection signal P_INIT is activated, the clock falling driving signal generation unit 230 generates the clock falling driving signal CKF_DN which is activated at the transition timing of the first delayed pulse signal CKR. The clock falling driving signal generation unit 230 includes a second select section MUX2 configured to output the clock falling driving signal CKF_DN which is activated in correspondence to the first delayed pulse signal CKR or the second delayed pulse signal CKF under the control of the initial phase difference detection signal P_INIT.

The clock output unit 240 is configured to output the output clock signal CK_OUT in response to the clock rising driving signal CKR_UP and the clock falling driving signal CKF_DN. The clock output unit 240 includes a clock driving section 242 configured to pull-up/pull-down drive a clock output terminal N0 in response to the clock rising driving signal CKR_UP and the clock falling driving signal CKF_DN, and a latch section 244 configured to latch the signal outputted from the clock output terminal N0.

Figure 6:
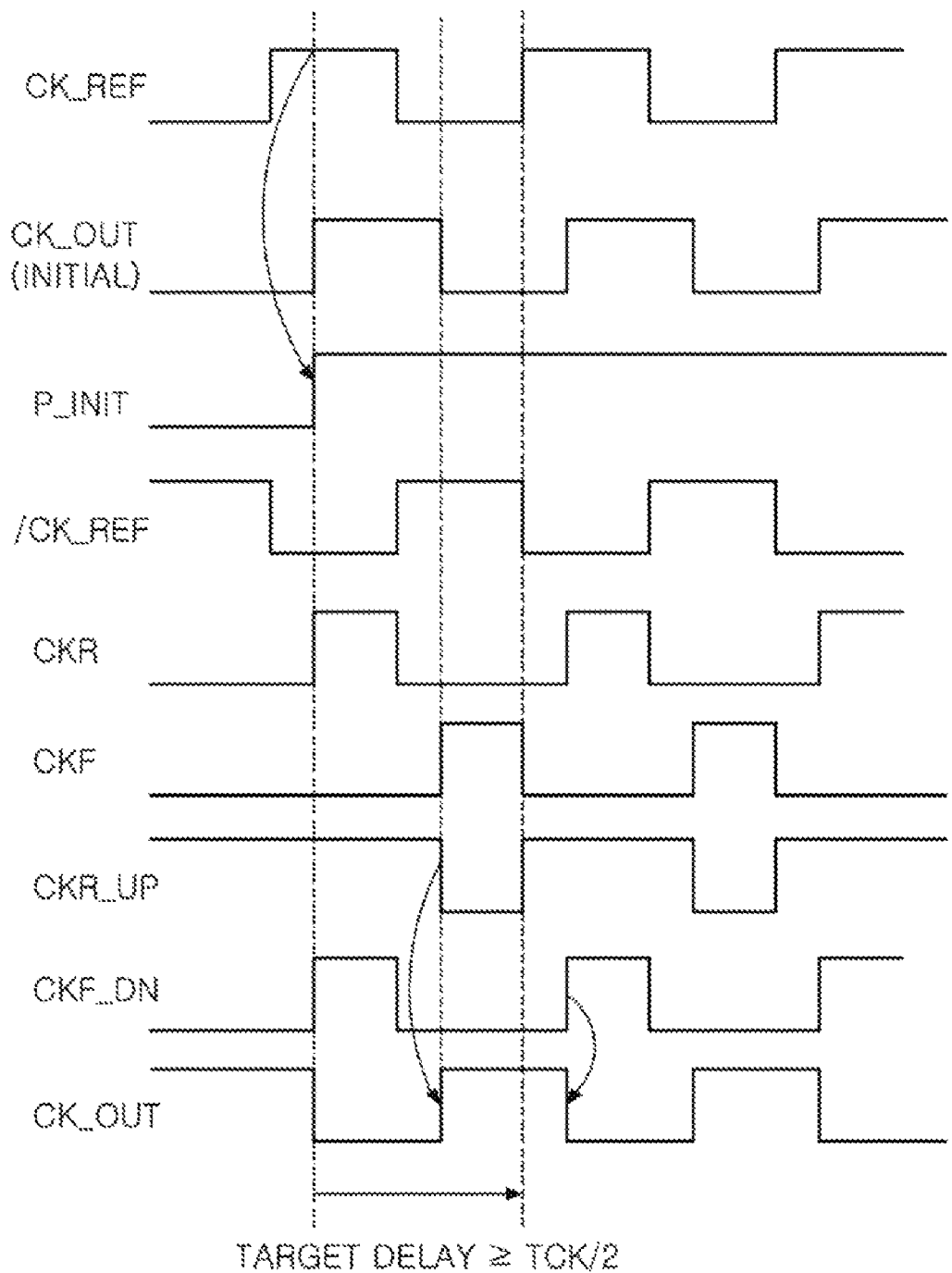
FIG. 6 is a timing diagram illustrating the operations of the variable unit delay block shown in FIG. 5.

FIG. 6 is a timing diagram illustrating the operations of the variable unit delay block shown in FIG. 5.

The operation of the variable unit delay block 20 configured as mentioned above will be described below with reference to the timing diagram of FIG. 6 together with FIG. 5.

The first delayed pulse signal CKR transits to a high level at a delayed timing after the rising edge of the reference clock signal CK_REF by the control voltage V_CTRL.

The second delayed pulse signal CKF transits to a high level at a delayed timing after the falling edge of the reference clock signal CK_REF by the control voltage V_CTRL.

Since the initial phase difference detection signal P_INIT is activated to a high level, the clock rising driving signal CKR_UP is activated to a low level in correspondence to the pulse duration of the second delayed pulse signal CKF. The clock falling driving signal CKF_DN is activated to a high level in correspondence to the pulse duration of the first delayed pulse signal CKR.

Finally, the output clock signal CK_OUT is generated under the control of the clock rising driving signal CKR_UP and the clock falling driving signal CKF_DN.

The timing diagram shown in FIG. 6 represents a part of the initial operation period of the variable unit delay block 20.

The above-described operation is repeated until the phases of the reference clock signal CK_REF and the output clock signal CK_OUT are finally made to coincide. As can be readily seen from the timing diagram, if the initial phase difference detection signal P_INIT is activated to the high level, the variable unit delay block 20 can delay the reference clock signal CK_REF up to the delay amount corresponding to one cycle at the maximum. For reference, if the initial phase difference detection signal P_INIT has a low level, the variable unit delay block 20 may delay the reference clock signal CK_REF up to the delay amount corresponding to one half cycle at the maximum.

Figure 7:
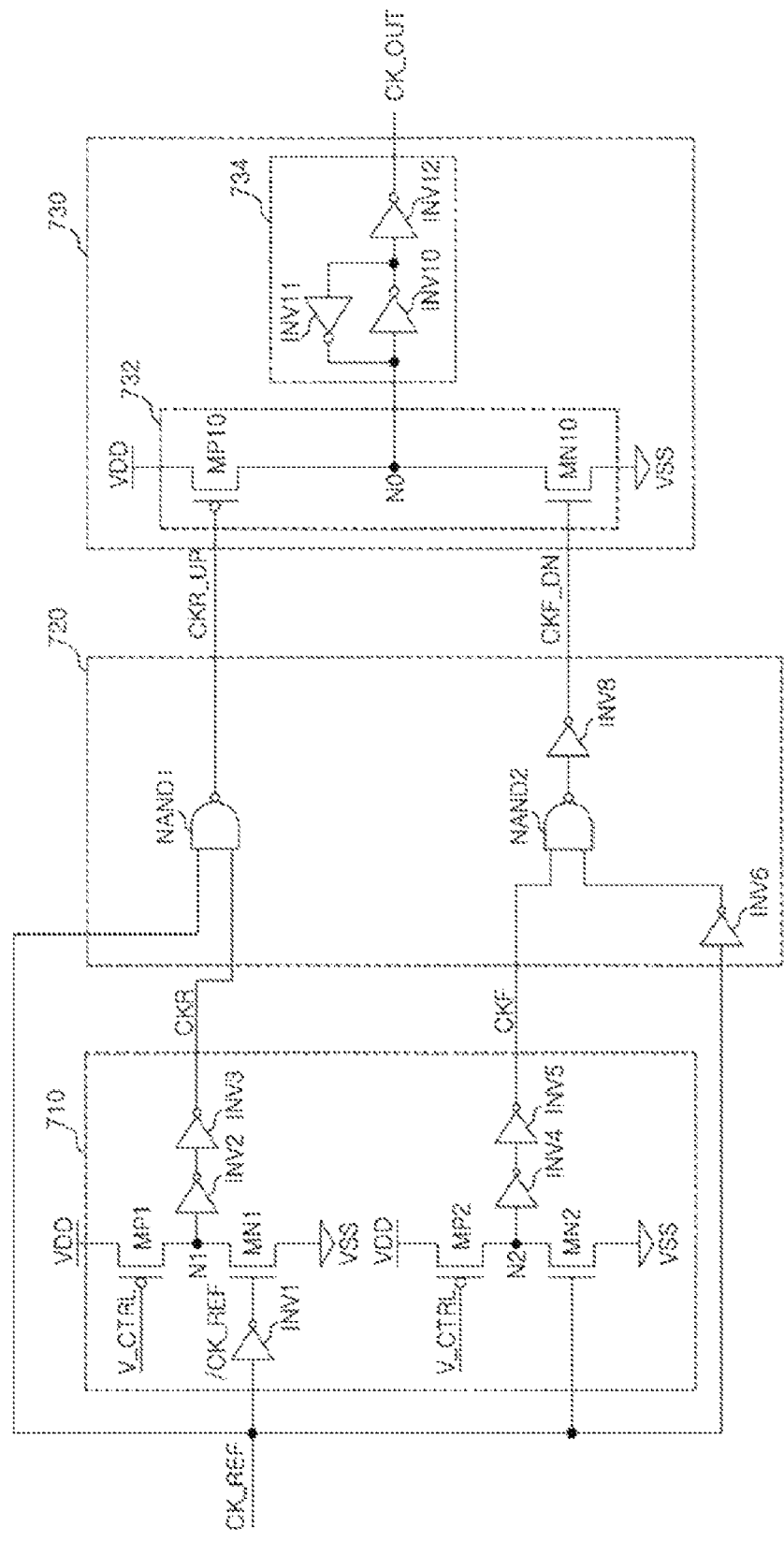
FIG. 7 is a circuit diagram illustrating another embodiment of a variable unit delay block.

FIG. 7 is a circuit diagram illustrating another embodiment of the variable unit delay block.

Referring to FIG. 7, the variable unit delay block includes a delayed pulse generation unit 710, a clock driving signal generation unit 720, and a clock output unit 730. For reference, the variable unit delay block shown in FIG. 7 is not controlled by an initial phase difference detection signal and is confined in the control range of the delay amount thereof.

The delayed pulse generation unit 710 is configured to generate a first delayed pulse signal CKR which has a delayed transition timing after the rising edge of the reference clock signal CK_REF in the high level duration of the reference clock signal CK_REF and a second delayed pulse signal CKF which has a delayed transition timing after the falling edge of the reference clock signal CK_REF in the low level duration of the reference clock signal CK_REF. The delay amounts of the first and second delayed pulse signals CKR and CKF are controlled based on the voltage level of the control voltage V_CTRL. The delayed pulse generation unit 710 includes a first pull-up driving section MP1 configured to control a pull-up driving force to a first output terminal N1 according to the voltage level of the control voltage V_CTRL, a first pull-down driving section MN1 configured to pull-down drive the first output terminal N1 under the control of the inverted signal of the reference clock signal CK_REF, a second pull-up driving section MP2 configured to control a pull-up driving force to a second output terminal N2 according to the voltage level of the control voltage V_CTRL, and a second pull-down driving section MN2 configured to pull-down drive the second output terminal N2 under the control of the reference clock signal CK_REF.

The clock driving signal generation unit 720 is configured to generate a clock rising driving signal CKR_UP which is activated at the transition timing of the first delayed pulse signal CKR and a clock falling driving signal CKF_DN which is activated at the transition timing of the second delayed pulse signal CKF. The clock driving signal generation unit 720 includes a first logic section NAND1 configured to NAND the reference clock signal CK_REF and the first delayed pulse signal CKR and generate the clock rising driving signal CKR_UP, and a second logic section NAND2 and INV8 configured to AND the inverted signal of the reference clock signal CK_REF and the second delayed pulse signal CKF and generate the clock falling driving signal CKF_DN.

The clock output unit 730 is configured to output the output clock signal CK_OUT in response to the clock rising driving signal CKR_UP and the clock falling driving signal CKF_DN. The clock output unit 730 includes a clock driving section 732 configured to pull-up/pull-down drive a clock output terminal N0 in response to the clock rising driving signal CKR_UP and the clock falling driving signal CKF_DN, and a latch section 734 configured to latch the signal outputted from the clock output terminal N0.

Figure 8:
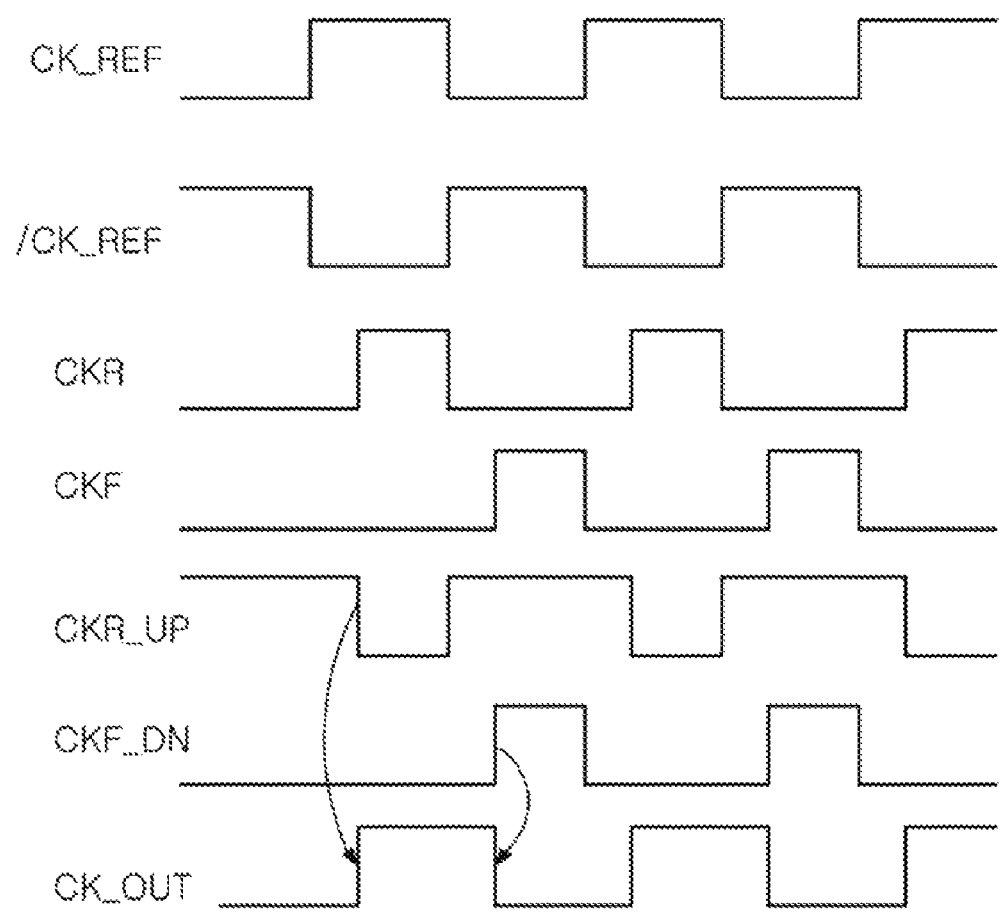
FIG. 8 is a timing diagram illustrating the operations of the variable unit delay block shown in FIG. 7.

FIG. 8 is a timing diagram illustrating the operations of the variable unit delay block shown in FIG. 7.

The operation of the variable unit delay block configured as mentioned above will be described below with reference to the timing diagram of FIG. 8 together with FIG. 7.

The first delayed pulse signal CKR transits to a high level at a delayed timing after the rising edge of the reference clock signal CK_REF by the control voltage V_CTRL.

The second delayed pulse signal CKF transits to a high level at a delayed timing after the falling edge of the reference clock signal CK_REF by the control voltage V_CTRL.

The clock rising driving signal CKR_UP is activated to a low level in correspondence to the pulse duration of the first delayed pulse signal CKR. The clock falling driving signal CKF_DN is activated to a high level in correspondence to the pulse duration of the second delayed pulse signal CKF.

Finally, the output clock signal CK_OUT is generated under the control of the clock rising driving signal CKR_UP and the clock falling driving signal CKF_DN.

The timing diagram shown in FIG. 8 represents a part of the initial operation period of the variable unit delay block. The above-described operation is repeated until the phases of the reference clock signal CK_REF and the output clock signal CK_OUT are finally made to coincide. The variable unit delay block can delay the reference clock signal CK_REF up to the delay amount corresponding to one half cycle at the maximum.

Figure 9:
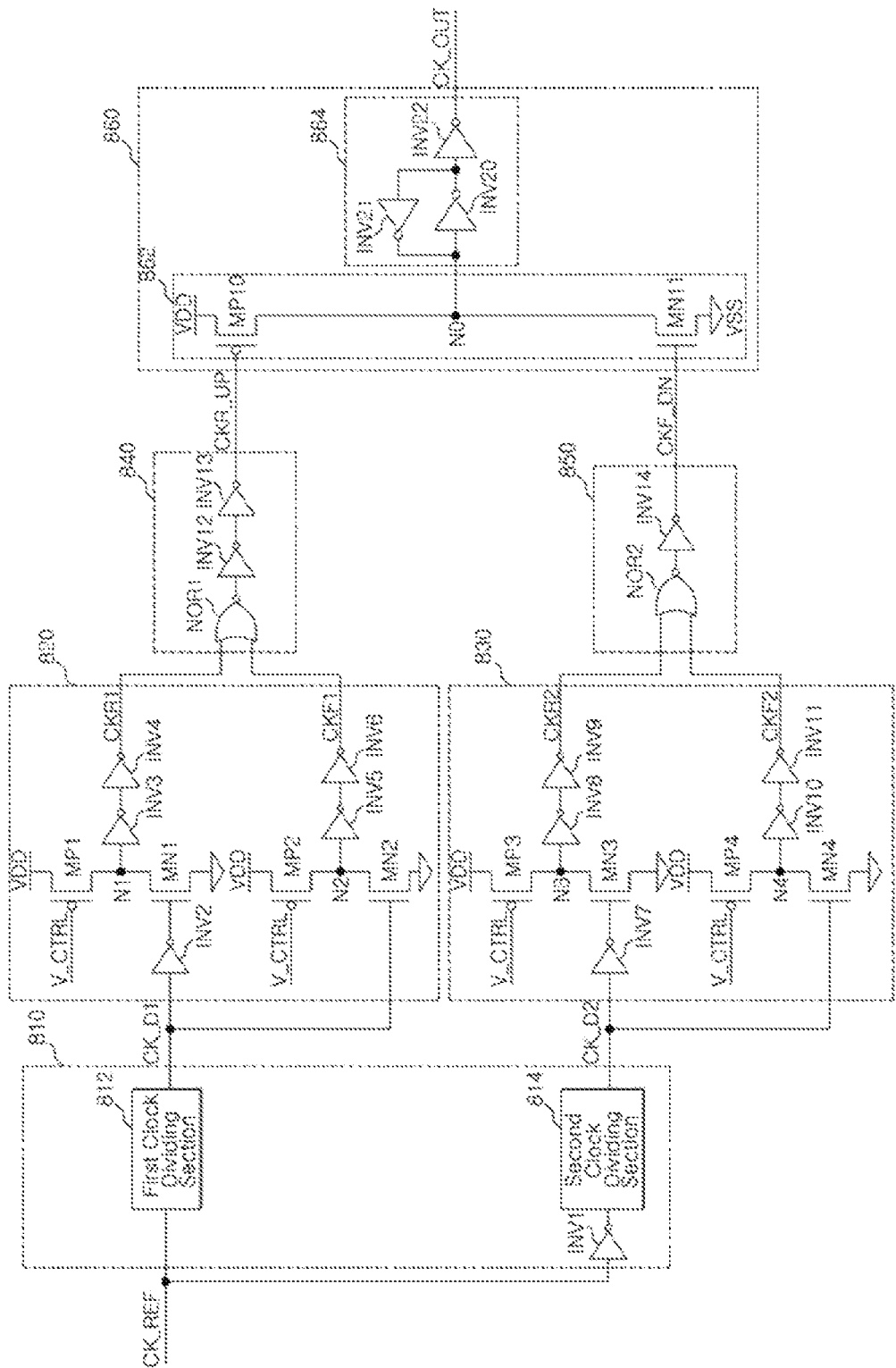
FIG. 9 is a circuit diagram illustrating another embodiment of a variable unit delay block.

FIG. 9 is a circuit diagram illustrating another embodiment of the variable unit delay block.

Referring to FIG. 9, the variable unit delay block includes a clock dividing unit 810, a first delayed pulse generation unit 820, a second delayed pulse generation unit 830, a clock rising driving signal generation unit 840, a clock falling driving signal generation unit 850, and a clock output unit 860. For reference, the variable unit delay block shown in FIG. 9 is not controlled by an initial phase difference detection signal and is confined in the control range of the delay amount thereof.

The clock dividing unit 810 is configured to divide the reference clock signal CK_REF, and output a first divided clock signal CK_D1 and a second divided clock signal CK_D2 which is delayed more by one half cycle of the reference clock signal CK_REF than the first divided clock signal CK_D1. In the embodiment, the clock dividing unit 810 divides by two the reference clock signal CK_REF. The clock dividing unit 810 includes a first clock dividing section 812 configured to divide by two the reference clock signal CK_REF and output the first divided clock signal CK_D1, and a second clock dividing section 814 configured to divide by two the inverted signal of the reference clock signal CK_REF and output the second divided clock signal CK_D2.

The first delayed pulse generation unit 820 is configured to generate a first delayed pulse signal CKR1 which has a delayed transition timing after the rising edge of the first divided clock signal CK_D1 in the high level duration of the first divided clock signal CK_D1 and a second delayed pulse signal CKF1 which has a delayed transition timing after the falling edge of the first divided clock signal CK_D1 in the low level duration of the first divided clock signal CK_D1. The first delayed pulse generation unit 820 includes a first pull-up driving section MP1 configured to control a pull-up driving force to a first output terminal N1 according to the voltage level of the control voltage V_CTRL, a first pull-down driving section MN1 configured to pull-down drive the first output terminal N1 under the control of the inverted signal of the first divided clock signal CK_D1, a second pull-up driving section MP2 configured to control a pull-up driving force to a second output terminal N2 according to the voltage level of the control voltage V_CTRL, and a second pull-down driving section MN2 configured to pull-down drive the second output terminal N2 under the control of the first divided clock signal CK_D1. The delay amounts of the first delayed pulse signal CKR1 and the second delayed pulse signal CKF1 are controlled according to the voltage level of the control voltage V_CTRL.

The second delayed pulse generation unit 830 is configured to generate a third delayed pulse signal CKR2 which has a delayed transition timing after the rising edge of the second divided clock signal CK_D2 in the high level duration of the second divided clock signal CK_D2 and a fourth delayed pulse signal CKF2 which has a delayed transition timing after the falling edge of the second divided clock signal CK_D2 in the low level duration of the second divided clock signal CK_D2. The second delayed pulse generation unit 830 includes a third pull-up driving section MP3 configured to control a pull-up driving force to a third output terminal N3 according to the voltage level of the control voltage V_CTRL, a third pull-down driving section MN3 configured to pull-down drive the third output terminal N3 under the control of the inverted signal of the second divided clock signal CK_D2, a fourth pull-up driving section MP4 configured to control a pull-up driving force to a fourth output terminal N4 according to the voltage level of the control voltage V_CTRL, and a fourth pull-down driving section MN4 configured to pull-down drive the fourth output terminal N4 under the control of the second divided clock signal CK_D2. The delay amounts of the third delayed pulse signal CKR2 and the fourth delayed pulse signal CKF2 are controlled based on the voltage level of the control voltage V_CTRL.

The clock rising driving signal generation unit 840 is configured to generate a clock rising driving signal CKR_UP which is activated at the respective transition timings of the first delayed pulse signal CKR1 and the second delayed pulse signal CKF1. The clock rising driving signal generation unit 840 includes a first logic section NOR1, INV12 and INV13 configured to logically combine the first delayed pulse signal CKR1 and the second delayed pulse signal CKF1 and generate the clock rising driving signal CKR_UP.

The clock falling driving signal generation unit 850 is configured to generate a clock falling driving signal CKF_DN which is activated at the respective transition timings of the third delayed pulse signal CKR2 and the fourth delayed pulse signal CKF2. The clock falling driving signal generation unit 850 includes a second logic section NOR2 and INV14 configured to logically combine the third delayed pulse signal CKR2 and the fourth delayed pulse signal CKF2 and generate the clock falling driving signal CKF_DN.

The clock output unit 860 is configured to output the output clock signal CK_OUT in response to the clock rising driving signal CKR_UP and the clock falling driving signal CKF_DN. The clock output unit 860 includes a clock driving section 862 configured to pull-up/pull-down drive a clock output terminal N0 in response to the clock rising driving signal CKR_UP and the clock falling driving signal CKF_DN, and a latch section 864 configured to latch the signal outputted from the clock output terminal N0.

Figure 10:
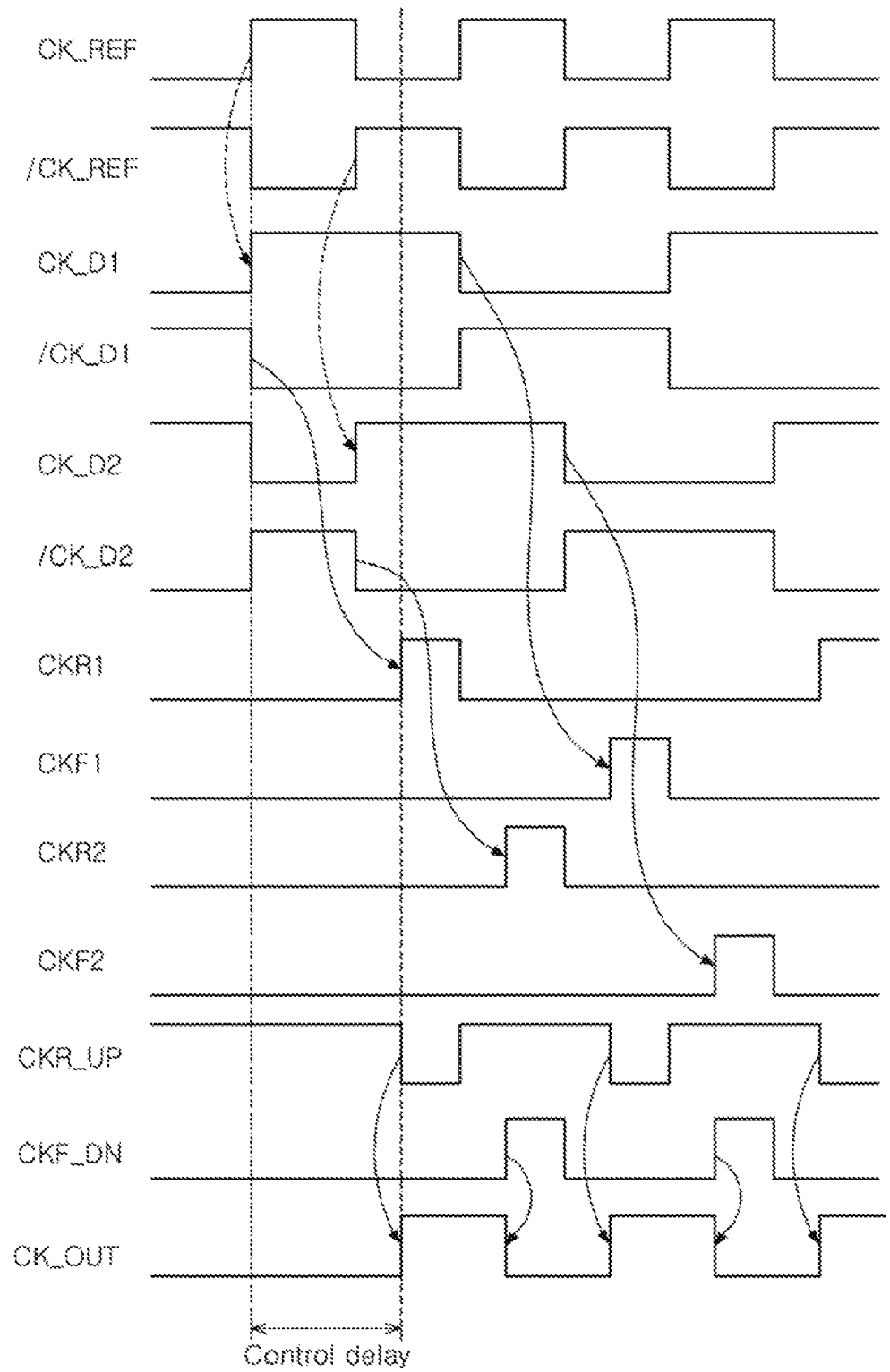
FIG. 10 is a timing diagram illustrating the operations of the variable unit delay block shown in FIG. 9.

FIG. 10 is a timing diagram illustrating the operations of the variable unit delay block shown in FIG. 9.

The operation of the variable unit delay block configured as mentioned above will be described below with reference to the timing diagram of FIG. 10 together with FIG. 9.

The reference clock signal CK_REF is divided by two in the first clock dividing section 812 and is outputted as the first divided clock signal CK_D1.

Also, the reference clock signal CK_REF is divided by two in the second clock dividing section 814 and is outputted as the second divided clock signal CK_D2. The second divided clock signal CK_D2 may be defined as a signal which is delayed more by one half cycle of the reference clock signal CK_REF than the first divided clock signal CK_D1.

The first delayed pulse signal CKR1 transits to a high level at a delayed timing after the rising edge of the first divided clock signal CK_D1 by the control voltage V_CTRL. The second delayed pulse signal CKF1 transits to a high level at a delayed timing after the falling edge of the first divided clock signal CK_D1 by the control voltage V_CTRL.

The third delayed pulse signal CKR2 transits to a high level at a delayed timing after the rising edge of the second divided clock signal CK_D2 by the control voltage V_CTRL. The fourth delayed pulse signal CKF2 transits to a high level at a delayed timing after the falling edge of the second divided clock signal CK_D2 by the control voltage V_CTRL.

The clock rising driving signal CKR_UP is activated to a low level in correspondence to the pulse durations of the first delayed pulse signal CKR1 and the second delayed pulse signal CKF1. The clock falling driving signal CKF_DN is activated to a high level in correspondence to the pulse durations of the third delayed pulse signal CKR2 and the fourth delayed pulse signal CKF2.

Finally, the output clock signal CK_OUT is generated under the control of the clock rising driving signal CKR_UP and the clock falling driving signal CKF_DN.

The timing diagram shown in FIG. 10 represents a part of the initial operation period of the variable unit delay block. The above-described operation is repeated until the phases of the reference clock signal CK_REF and the output clock signal CK_OUT are finally made to coincide. The variable unit delay block can delay the reference clock signal CK_REF up to the delay amount corresponding to one cycle of the reference clock signal CK_REF at the maximum.

So far, embodiments of the present invention have been described in detail. For reference, embodiments including additional component elements, which are not directly associated with the technical ideas of the present invention, may be exemplified in order to describe the present invention in further detail. Moreover, an active high configuration or an active low configuration for indicating the activated states of signals and circuits may vary based on an embodiment. It is to be understood that, in order to realize the same function, the configurations of logic gates may be changed as the occasion demands. That is to say, NANDing units, NORing units, etc. can be configured through various combinations of NAND gates, NOR gates, inverters, and so forth. Since these circuit changes have a large number of cases and can be easily inferred by those skilled in the art, the enumeration thereof will be omitted herein.

While certain embodiments have been described above, it will be understood to those skilled in the art that the embodiments described are by way of example only. Accordingly, the variable unit delay circuit and the clock generation circuit of a semiconductor apparatus using the same described herein should not be limited based on the described embodiments. Rather, the variable unit delay circuit and the clock generation circuit of a semiconductor apparatus using the same described herein should only be limited in light of the claims that follow when taken in conjunction with the above description and accompanying drawings.

What is claimed is:

1. A clock generation circuit of a semiconductor apparatus, comprising:

a first phase detection block configured to compare initial phases of a reference clock signal and an output clock signal in response to an operation start signal, and output an initial phase difference detection signal corresponding to a comparison result;

a second phase detection block configured to compare phases of the reference clock signal and the output clock signal, and output a phase detection signal corresponding to a comparison result;

a variable unit delay block configured to determine a control range of the delay amount thereof in response to the initial phase difference detection signal, and to delay the reference clock signal by a delay amount corresponding to a voltage level of a control voltage and output the output clock signal, wherein the control range of the delay amount has a delay amount corresponding to one half cycle or one cycle of the reference clock signal based on the initial phase difference detection signal; and a delay control block configured to generate the control voltage which has the voltage level corresponding to the phase detection signal.

2. The clock generation circuit according to claim 1, wherein the first phase detection block compares the initial phases of the reference clock signal and the output clock signal during a preset initial period in a power-up operation.

3. The clock generation circuit according to claim 1, wherein the variable unit delay block comprises:

a delayed pulse generation unit configured to generate a first delayed pulse signal which has a delayed transition timing after a rising edge of the reference clock signal in a high level duration of the reference clock signal and a second delayed pulse signal which has a delayed transition timing after a falling edge of the reference clock signal in a low level duration of the reference clock signal;

a clock rising driving signal generation unit configured to generate a clock rising driving signal which is activated at the transition timing of the first delayed pulse signal, when the initial phase difference detection signal is deactivated, and which is activated at the transition timing of the second delayed pulse signal, when the initial phase difference detection signal is activated;

a clock falling driving signal generation unit configured to generate a clock falling driving signal which is activated at the transition timing of the second delayed pulse signal, when the initial phase difference detection signal is deactivated, and which is activated at the transition timing of the first delayed pulse signal, when the initial phase difference detection signal is activated; and a clock output unit configured to output the output clock signal in response to the clock rising driving signal and the clock falling driving signal.

4. The clock generation circuit according to claim 3, wherein delay amounts of the first and second delayed pulse signals are controlled based on the voltage level of the control voltage.

5. The clock generation circuit according to claim 3, wherein the delayed pulse generation unit comprises:

a first pull-up driving section configured to control a pull-up driving force to a first output terminal according to the voltage level of the control voltage;

a first pull-down driving section configured to pull-down drive the first output terminal under the control of an inverted signal of the reference clock signal;

a second pull-up driving section configured to control a pull-up driving force to a second output terminal according to the voltage level of the control voltage; and a second pull-down driving section configured to pull-down drive the second output terminal under the control of the reference clock signal.

6. The clock generation circuit according to claim 3, wherein the clock rising driving signal generation unit comprises:

a first select section configured to output the clock rising driving signal which is activated in correspondence to the first delayed pulse signal or the second delayed pulse signal under the control of the initial phase difference detection signal.

7. The clock generation circuit according to claim 6, wherein the clock falling driving signal generation unit comprises:

a second select section configured to output the clock falling driving signal which is activated in correspondence to the first delayed pulse signal or the second delayed pulse signal under the control of the initial phase difference detection signal.

8. The clock generation circuit according to claim 3, wherein the clock output unit comprises:

a clock driving section configured to pull-up/pull-down drive a clock output terminal in response to the clock rising driving signal and the clock falling driving signal; and a latch section configured to latch a signal outputted from the clock output terminal.

9. The clock generation circuit according to claim 1, further comprising:

a clock buffer block configured to buffer an input clock signal and output the reference clock signal.

10. A method for generating a clock signal through a variable unit delay block configured to delay a reference clock signal and output an output clock signal, the method comprising the steps of:

detecting an initial phase difference between the reference clock signal and the output clock signal;

determining a control range of the delay amount of the variable unit delay block based on a detection result for the initial phase difference; and controlling a delay amount of the variable unit delay block within the control range of the delay amount, wherein the control range of the delay amount of the variable unit delay block has a delay amount corresponding to one half cycle or one cycle of the reference clock signal based on the detection result for the initial phase difference.

11. The method according to claim 10, wherein the delay amount of the variable unit delay block is controlled until phases of the reference clock signal and the output clock signal coincide.

* * * * *